(12) United States Patent
Shum

(10) Patent No.: US 8,674,395 B2
(45) Date of Patent: Mar. 18, 2014

(54) SYSTEM AND METHOD FOR LED PACKAGING

(75) Inventor: Frank Tin Chung Shum, Sunnyvale, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

(21) Appl. No.: 13/482,956

(22) Filed: May 29, 2012

(65) Prior Publication Data

US 2012/0235201 A1 Sep. 20, 2012

Related U.S. Application Data

(62) Division of application No. 12/879,784, filed on Sep. 10, 2010, now Pat. No. 8,207,554.

(60) Provisional application No. 61/241,455, filed on Sep. 11, 2009, provisional application No. 61/241,457, filed on Sep. 11, 2009, provisional application No. 61/241,459, filed on Sep. 11, 2009.

(51) Int. Cl.
*H01L 33/00* (2010.01)

(52) U.S. Cl.
USPC .............................. 257/99; 257/707; 257/774

(58) Field of Classification Search
USPC ....................... 257/99, 706, 707, 774, 676, 88
See application file for complete search history.

(56) References Cited

U.S. PATENT DOCUMENTS

| | | | |
|---|---|---|---|
| 6,335,771 B1 | 1/2002 | Hiraishi | |
| 6,498,355 B1 * | 12/2002 | Harrah et al. | ................... 257/99 |
| 6,864,641 B2 | 3/2005 | Dygert | |
| 6,956,246 B1 | 10/2005 | Epler et al. | |
| 7,009,199 B2 | 3/2006 | Hall | |
| 7,083,302 B2 | 8/2006 | Chen et al. | |
| 7,113,658 B2 | 9/2006 | Ide et al. | |
| 7,285,799 B2 | 10/2007 | Kim et al. | |
| 7,560,981 B2 | 7/2009 | Chao et al. | |
| 7,737,457 B2 | 6/2010 | Kolodin et al. | |
| 7,791,093 B2 | 9/2010 | Basin et al. | |
| 7,906,793 B2 * | 3/2011 | Negley | ............................ 257/98 |
| 8,044,609 B2 | 10/2011 | Liu | |
| 8,203,161 B2 | 6/2012 | Simonian et al. | |
| 8,269,245 B1 | 9/2012 | Shum | |

(Continued)

OTHER PUBLICATIONS

Iso et al., 'High Brightness Blue InGaN/GaN Light Emitting Diode on Nonpolar m-Plane Bulk GaN Substrate,' Japanese Journal of Applied Physics, 2007, vol. 46, No. 40, pp. L960-L962.

(Continued)

*Primary Examiner* — William D Coleman
*Assistant Examiner* — John M Parker
(74) *Attorney, Agent, or Firm* — Kilpatrick Townsend & Stockton LLP

(57) ABSTRACT

System and method for LED packaging. The present invention is directed to optical devices. More specifically, embodiments of the presentation provide LED packaging having one or more reflector surfaces. In certain embodiments, the present invention provides LED packages that include thermal pad structures for dissipating heat generated by LED devices. In particular, thermal pad structures with large surface areas are used to allow heat to transfer. In certain embodiments, thick thermally conductive material is used to improve overall thermal conductivity of an LED package, thereby allowing heat generated by LED devices to dissipate quickly. Depending on the application, thermal pad structure, thick thermal conductive layer, and reflective surface may be individually adapted in LED packages or used in combinations. There are other embodiments as well.

26 Claims, 12 Drawing Sheets

(56) References Cited

U.S. PATENT DOCUMENTS

| | | | |
|---|---|---|---|
| 8,404,071 B2 | 3/2013 | Cope et al. | |
| 8,410,711 B2 | 4/2013 | Lin et al. | |
| 2001/0022495 A1* | 9/2001 | Salam | 313/499 |
| 2004/0190304 A1 | 9/2004 | Sugimoto et al. | |
| 2004/0195598 A1 | 10/2004 | Tysoe et al. | |
| 2004/0227149 A1* | 11/2004 | Ibbetson et al. | 257/100 |
| 2005/0084218 A1 | 4/2005 | Ide et al. | |
| 2005/0199899 A1* | 9/2005 | Lin et al. | 257/99 |
| 2005/0224830 A1 | 10/2005 | Blonder et al. | |
| 2006/0006404 A1 | 1/2006 | Ibbetson et al. | |
| 2006/0038542 A1 | 2/2006 | Park et al. | |
| 2006/0068154 A1 | 3/2006 | Parce et al. | |
| 2006/0097385 A1* | 5/2006 | Negley | 257/722 |
| 2006/0205199 A1 | 9/2006 | Baker et al. | |
| 2007/0018184 A1 | 1/2007 | Beeson et al. | |
| 2007/0114563 A1 | 5/2007 | Paek et al. | |
| 2007/0170450 A1 | 7/2007 | Murphy | |
| 2007/0181895 A1* | 8/2007 | Nagai | 257/98 |
| 2008/0194054 A1* | 8/2008 | Lin et al. | 438/64 |
| 2008/0206925 A1 | 8/2008 | Chatterjee et al. | |
| 2008/0210958 A1 | 9/2008 | Senda et al. | |
| 2008/0261341 A1 | 10/2008 | Zimmerman et al. | |
| 2009/0250686 A1 | 10/2009 | Sato et al. | |
| 2009/0252191 A1 | 10/2009 | Kubota et al. | |
| 2009/0309110 A1 | 12/2009 | Raring et al. | |
| 2010/0001300 A1 | 1/2010 | Raring et al. | |
| 2010/0006873 A1 | 1/2010 | Raring et al. | |
| 2010/0148210 A1* | 6/2010 | Huang et al. | 257/99 |
| 2010/0164403 A1 | 7/2010 | Liu | |
| 2011/0038154 A1 | 2/2011 | Chakravarty et al. | |
| 2011/0068700 A1 | 3/2011 | Fan | |
| 2011/0069490 A1 | 3/2011 | Liu | |
| 2011/0103064 A1 | 5/2011 | Coe-Sullivan et al. | |
| 2011/0108865 A1 | 5/2011 | Aldaz et al. | |
| 2011/0291548 A1 | 12/2011 | Nguyen et al. | |
| 2011/0317397 A1 | 12/2011 | Trottier et al. | |
| 2012/0043552 A1 | 2/2012 | David et al. | |
| 2012/0299492 A1 | 11/2012 | Egawa et al. | |
| 2012/0313541 A1 | 12/2012 | Egawa et al. | |
| 2013/0043799 A1 | 2/2013 | Siu et al. | |

OTHER PUBLICATIONS

International Search Report of PCT Application No. PCT/US2011/048499, dated Feb. 14, 2012, 2 pages total.

Sato et al., 'Optical Properties of Yellow Light-Emitting Diodes Grown on Semipolar (1122) Bulk GaN Substrate,' Applied Physics Letters, vol. 92, No. 22, 2008, pp. 221110-1-221110-3.

USPTO Office Action for U.S. Appl. No. 12/481,543 dated Jun. 27, 2011.

USPTO Office Action for U.S. Appl. No. 12/491,176 dated Mar. 1, 2012.

USPTO Office Action for U.S. Appl. No. 12/491,176 dated Jul. 19, 2012.

USPTO Office Action for U.S. Appl. No. 12/880,889 dated Feb. 27, 2012.

USPTO Office Action for U.S. Appl. No. 12/880,889 dated Sep. 19, 2012.

USPTO Office Action for U.S. Appl. No. 12/914,789 dated Oct. 12, 2011.

USPTO Office Action for U.S. Appl. No. 12/914,789 dated Feb. 24, 2012.

USPTO Notice of Allowance for U.S. Appl. No. 12/914,789 dated May 17, 2012.

USPTO Office Action for U.S. Appl. No. 13/019,897 dated Mar. 30, 2012.

USPTO Office Action for U.S. Appl. No. 13/025,833 dated Jul. 12, 2012.

USPTO Office Action for U.S. Appl. No. 13/211,145 dated Oct. 17, 2012.

Csuti et al., 'Color-matching experiments with RGB-LEDs', Color Research and Application, vol. 33, No. 2, 2008, pp. 1-9.

Davis et al., 'Color Quality Scale', Optical Engineering 49(3), 2010, pp. 033602-1-16.

Paper and Board Determination of CIE Whiteness, D65/10 (outdoor daylight), ISO International Standard 11475:2004E (2004), 18 pgs.

Whitehead et al., 'A Monte Carlo method for assessing color rendering quality with possible application to color rendering standards', Color Research and Application, vol. 37, No. 1, Feb. 2012, pp. 13-22.

USPTO Office Action for U.S. Appl. No. 13/019,897 dated Jan. 16, 2013.

USPTO Office Action for U.S. Appl. No. 13/210,769 dated Apr. 4, 2013.

USPTO Notice of Allowance for U.S. Appl. No. 13/298,905 dated Jun. 11, 2013.

* cited by examiner

US 8,674,395 B2

SYSTEM AND METHOD FOR LED PACKAGING

CROSS-REFERENCE TO RELATED APPLICATIONS

This application is a divisional application of U.S. patent application Ser. No. 12/879,784, filed on Sep. 10, 2010, which claims priority from U.S. Provisional Patent Application No. 61/241,459, filed on Sep. 11, 2009; U.S. Provisional Patent Application No. 61/241,457, filed on Sep. 11, 2009; and U.S. Provisional Patent Application No. 61/241,455, filed on Sep. 11, 2009, commonly assigned and incorporated by reference herein for all purposes.

BACKGROUND OF THE INVENTION

This invention is directed to optical devices. More specifically, embodiments of the invention provide LED packaging having reflector surfaces, and in some implementations provide LED packages that include thermal pad structures for dissipating heat generated by the LED devices. In particular, thermal pad structures with large surface areas are used to provide heat transfer. In certain embodiments, thick thermally conductive material is used to improve overall thermal conductivity of an LED package, thereby allowing heat generated by LED devices to dissipate quickly. Depending on the application, thermal pad structure, thick thermal conductive layer, and reflective surface may be individually adapted in LED packages or used in combinations.

In the late 1800's, Thomas Edison invented the light bulb. The conventional light bulb, commonly called the "Edison bulb," has been used for over one hundred years. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light. Unfortunately, the conventional Edison light bulb dissipates much thermal energy. More than 90% of the energy used for the conventional light bulb dissipates as thermal energy. Additionally, the conventional light bulb eventually fails due to evaporation of the tungsten filament.

Fluorescent lighting overcomes some of the drawbacks of the conventional light bulb. Fluorescent lighting uses an optically clear tube structure filled with a noble gas, and typically also contains mercury. A pair of electrodes is coupled between the gas and to an alternating power source through a ballast. Once the mercury has been excited, it discharges to emit UV light. Typically, the optically clear tube is coated with phosphors, which are excited by the UV light to provide white light. Many buildings use fluorescent lighting and, more recently, fluorescent lighting has been fitted onto a base structure, which couples into a standard socket for household use.

Solid state lighting techniques have also been developed. Solid state lighting relies upon semiconductor materials to produce light emitting diodes, commonly called LEDs. At first, red LEDs were demonstrated and introduced into commerce. Modern red LEDs use Aluminum Indium Gallium Phosphide or AlInGaP semiconductor materials. Most recently, Shuji Nakamura pioneered the use of InGaN materials to produce LEDs emitting light in the blue color range for blue LEDs. The blue LEDs led to innovations such as solid state white lighting, the blue laser diode, which in turn enabled the Blu-Ray™ DVD player (trademark of the Blu-Ray Disc Association), and other developments. Blue, violet, or ultraviolet-emitting devices based on InGaN are used in conjunction with phosphors to provide white LEDs. Other colored LEDs have also been proposed.

To take advantage of LED devices, well designed LED packages that house LED devices and provide electrical connections are essential. Numerous types of conventional LED packages have been used, however, they suffer from various disadvantages.

BRIEF SUMMARY OF THE INVENTION

This invention is directed to optical devices. More specifically, embodiments of the invention provide LED packaging having reflector surfaces, and in some implementations provide LED packages that include thermal pad structures for dissipating heat generated by the LED devices. In particular, thermal pad structures with large surface areas are used to provide heat transfer. In certain embodiments, thick thermally conductive material is used to improve overall thermal conductivity of an LED package, thereby allowing heat generated by LED devices to dissipate quickly. Depending on the application, thermal pad structure, thick thermal conductive layer, and reflective surface may be individually adapted in LED packages or used in combinations.

In one embodiment, this invention provides an optical device with a substrate and an interior surface. The device also includes a conductive layer having a thickness of at least 15 um overlying a portion of the surface. The optical device further includes an LED electrically coupled to the conductive layer, and a layer of insulating material overlaying the interior surface. A reflective layer overlies the insulating material, and preferably has a reflectivity of at least 95%.

According to another embodiment, the invention provides an optical device which includes a substrate with a flat surface. A first conductive region overlies a first portion of the flat surface, and a separate second conductive region overlies a second portion of the flat surface. The optical device includes a first via structure on the first conductive region, and an electrically separated second via structure on the second conductive region. The device additionally includes a thermal pad structure overlaying a third portion of the flat surface. The thermal pad structure is electrically insulated from the first conductive region and the second conductive region. The third portion preferably covers at least 50% of flat surface.

According to another embodiment, the invention provides an optical device. The device includes a substrate with an interior surface and a bottom side. A top conductive layer, preferably having a thickness of at least 15 um overlies a portion of the interface surface. A bottom conductive layer overlies a portion of the bottom side of the substrate. An LED is electrically coupled to a location of the top conductive layer, and a reflective layer overlies the top conductive layer. The reflective layer preferably has a reflectivity of at least 95%.

The device and method of manufacture provide for improved lighting with improved efficiency. They are easier to manufacture using conventional technologies. In certain embodiments, thermal management structures are able to greatly improve thermal conductivity of the LED package. In a specific instance, thermally conductive material as a part of the conductive layer can improve thermal conductivity by almost 50%. For example, the thermal conductivity of a conventional LED package is about 13° C./W. By increasing the thickness of conductive layers according to an embodiment of the present invention (e.g., 50 microns of copper material illustrated in FIG. 11), the thermal spreading resistance is lowered to 7° C./W. The use of insulating layers between the reflective layer and the conductive layer greatly improves reflectivity, which translates to more usable light coming out of the LED package. These and other benefits are further described throughout the present specification and more particularly below.

A further understanding of the nature and advantages of the present invention may be realized by reference to following portions of the specification and attached drawings

DETAILED DESCRIPTION OF THE INVENTION

Figure 1:
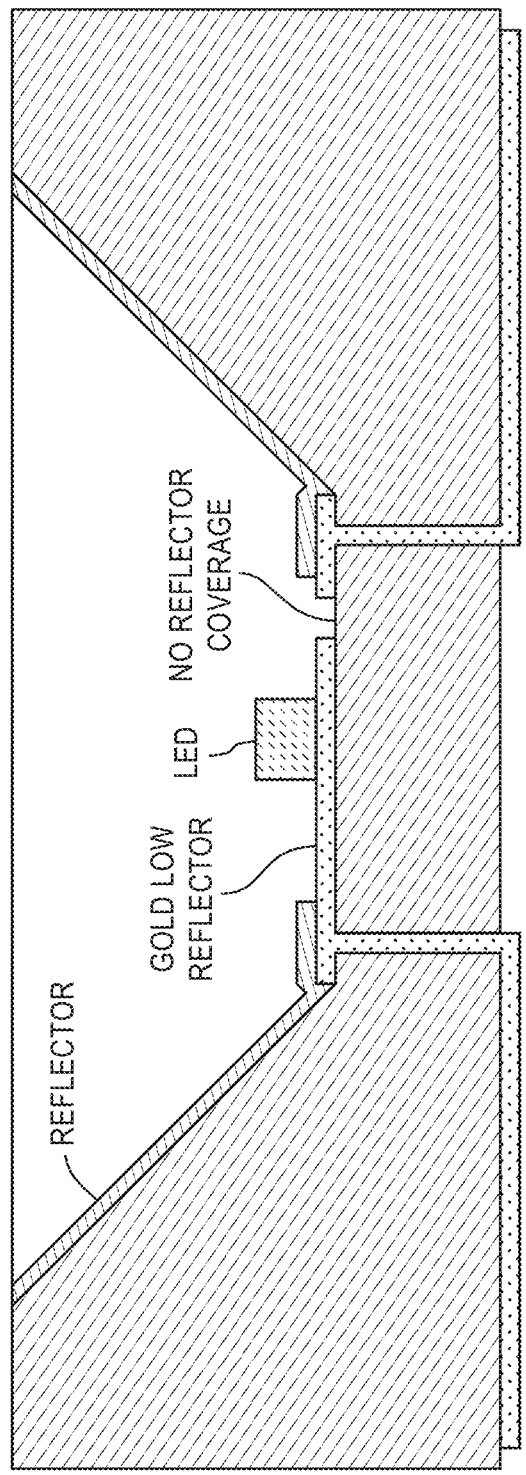
FIG. 1 is a simplified diagram illustrating a conventional LED package with a silicon cavity.

As explained above, LED chips are often used as a light source. For LED chips to function, they are secured into a package and electrically coupled to an energy source. The optical efficiency of an LED package is related the reflectivity of the cavity surfaces. FIG. 1 is a simplified diagram illustrating a conventional LED package silicon cavity. In the silicon cavity package illustrated in FIG. 1, certain regions (such as the isolation areas between electrical contacts, portion of exposed gold) have low optical reflectivity. As a result, these areas lower the overall reflectivity of the cavity and thus, the optical efficiency of the package. In addition, conventional reflectors are often inadequate.

Figure 2A:
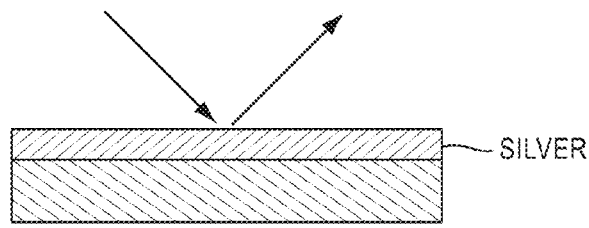
FIGS. 2(a) and 2(b) are simplified diagrams illustrating an enhanced reflector according to embodiments of the present invention.
Figure 2B:
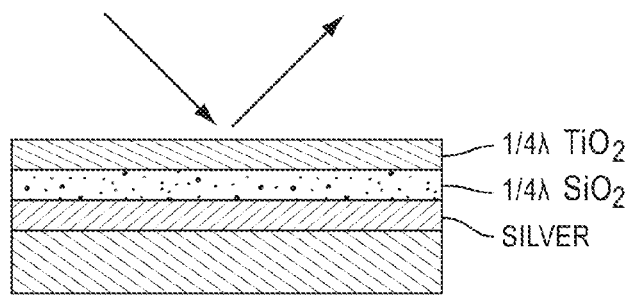

According to an embodiment, the invention provides an improved reflector. FIGS. 2(a) and 2(b) are simplified diagrams illustrating an enhancement reflector according to embodiments of the present invention. These diagrams are merely an example, which should not unduly limit the scope of the claims herein. One of ordinary skill in the art would recognize other variations, modifications, and alternatives. FIG. 2(a) illustrates a conventional reflector where reflective surface is provided by silver coating. Alternatively, the reflective surface can also be provided by aluminum or other types of coating. It is to be appreciated that embodiments of the present invention provides enhanced reflective surfaces, thereby improving the efficiency. More specifically, an enhanced reflective surface comprises of a layer of metal material (such as aluminum or silver over), and the metal material is coated with one or more layers of dielectric material. For example, a layer of ¼λ of $SiO_2$ and followed by another ¼λ or $TiO_2$ is provided on top of the metal material as shown in FIG. 2(a). Depending on the application, other types of materials and thickness may be used.

Figure 3:
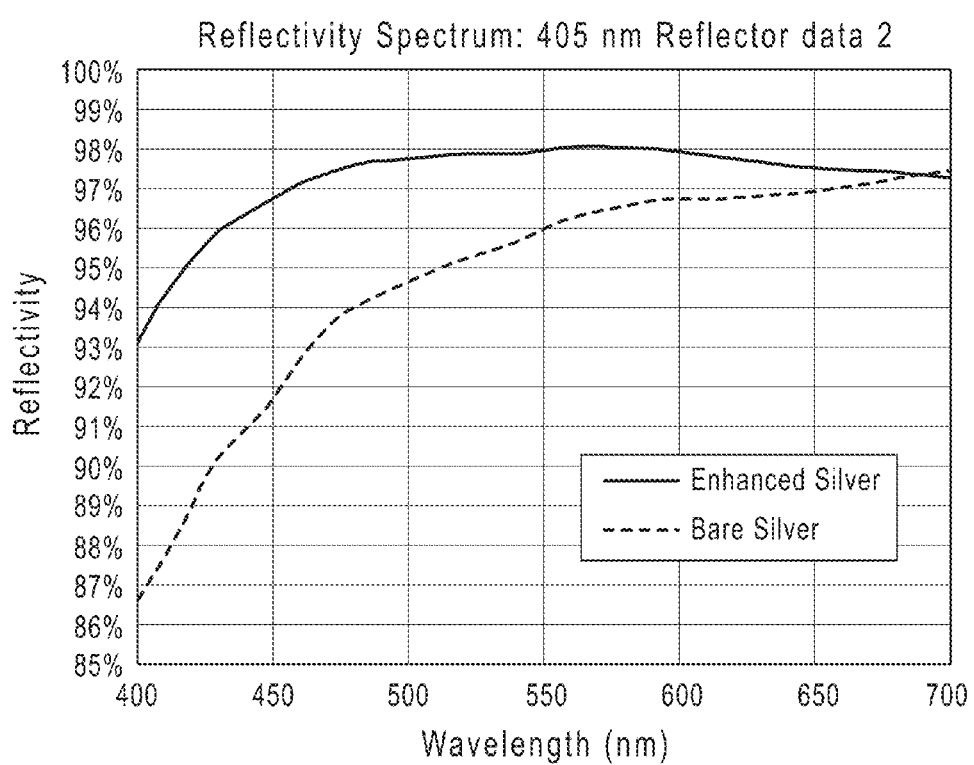
FIG. 3 is a simplified diagram illustrating reflectivity of an enhanced surface according to embodiments of the present invention.

FIG. 3 is a simplified diagram illustrating reflectivity of an enhanced surface according to embodiments of the present invention. This diagram is merely an example, which should not unduly limit the scope of the claims herein. One of ordinary skill in the art would recognize other variations, modifications, and alternatives. As shown in FIG. 3, an enhanced silver surface (e.g., with $SiO_2$ and $TiO_2$ coatings) is characterized by a much higher level of reflectivity at relatively shorter wavelength. More specifically, at 400 nm, the enhanced silver surface is characterized by a 93% reflectivity while the bare silver surface is characterized by an 86% reflectivity.

Figure 4:
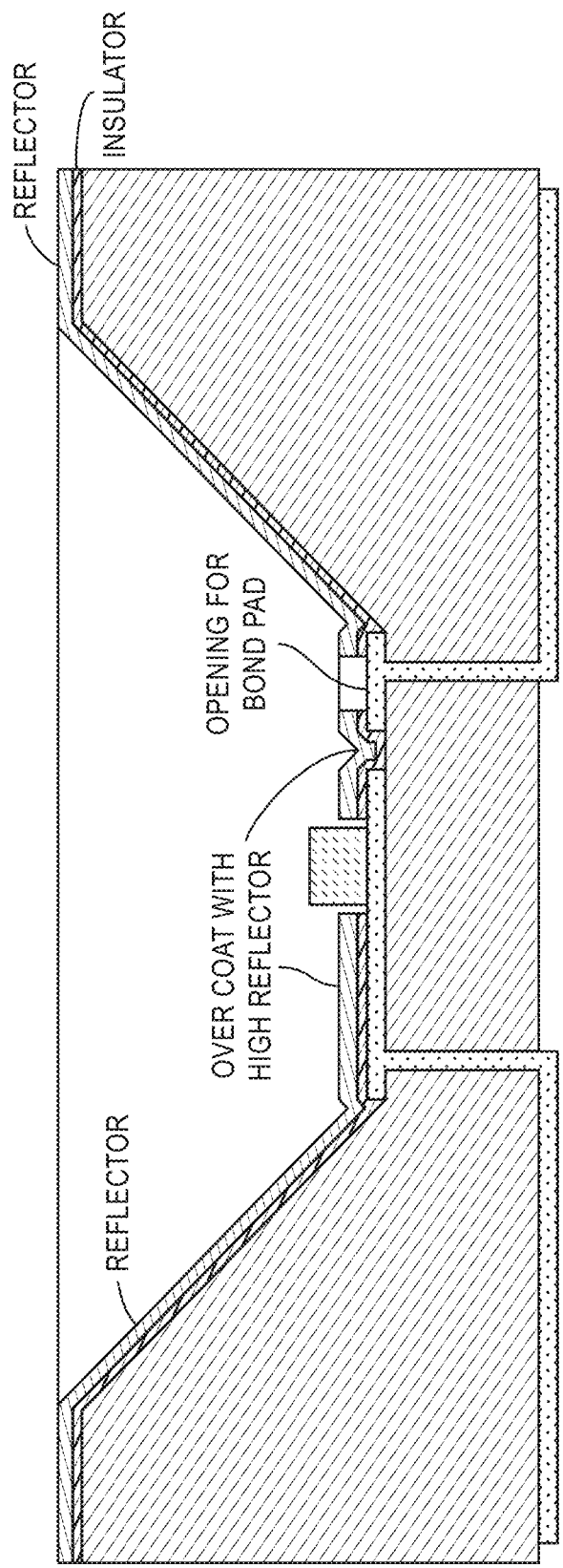
FIG. 4 is a simplified diagram illustrating an LED package according to embodiments of the present invention.

It is to be appreciated that embodiments of the present invention provides other ways to enhance reflectivity, thereby improving overall LED package performance. In certain embodiments, reflectivity of an LED package is enhanced by increasing the coverage of reflective areas. FIG. 4 is a simplified diagram illustrating an LED package according to embodiments of the present invention. This diagram is merely an example, which should not unduly limit the scope of the claims herein. One of ordinary skill in the art would recognize other variations, modifications, and alternatives. An electrically insulating layer (such as $SiO_2$) is provided underneath the reflector layer as shown in FIG. 4. Over certain portions, the insulating layer is provided over the inside of the gaps between the electrical leads. On top of this insulating layer, a high reflectivity mirror layer is deposited. Among other things, the highly reflective layer covers the low reflectivity areas. Depending on the application, the reflective layer may comprise different types of metal layer such as aluminum, silver, and/or others. In a specific embodiment, the metal reflectivity is enhanced by coating the metal reflective surface with one or more layers of dielectric material. For example, a layer of ¼λ of $SiO_2$ and followed by another ¼λ or $TiO_2$ is provided on top of the reflective metal material as described above.

In certain embodiments, the present invention provides thermal management means for the LED packages. More specifically, thermal management pads are provided for surface mount LED packages. For surface mount LED packages, the mounting surfaces typically have three contacts: two electrical contacts and an electrically isolated thermal contact. For example, an LED device is mounted onto a circuit board (such as a metal clad PCB) with matching contact pads. In operation, the LED device often generates a large of heat that needs to be dissipated, as the heat might cause problem even device break down.

In an embodiment, the heat generated by the LED package is conducted across one or more thermal pad structures. More specifically, the thermal pad structures with relatively large surface area are positioned in proximity of the electrical contacts. In principle, the area of the thermal pad directly affects the contact resistance. For example, a larger the thermal pad area translates a lower the thermal resistance, as heat can dissipate through the large area.

In an LED package that is mounted onto a metal clad PCB, the metal clad PCB has a dielectric layer that electrically isolates the electrical circuits from the base metal. For example, the base metal can be aluminum or copper. Unfortunately, the dielectric layer often has a very low thermal resistance of about 2.2° C./W compared to thermal resistance of copper at 400° C./W. As a result, the dielectric layer can be a thermal choke point. In particular for silicon packages where the VIA structures for the electrical contacts are formed by etching silicon substrate material, the VIA location can limit the size of the thermal pad.

Figure 5:
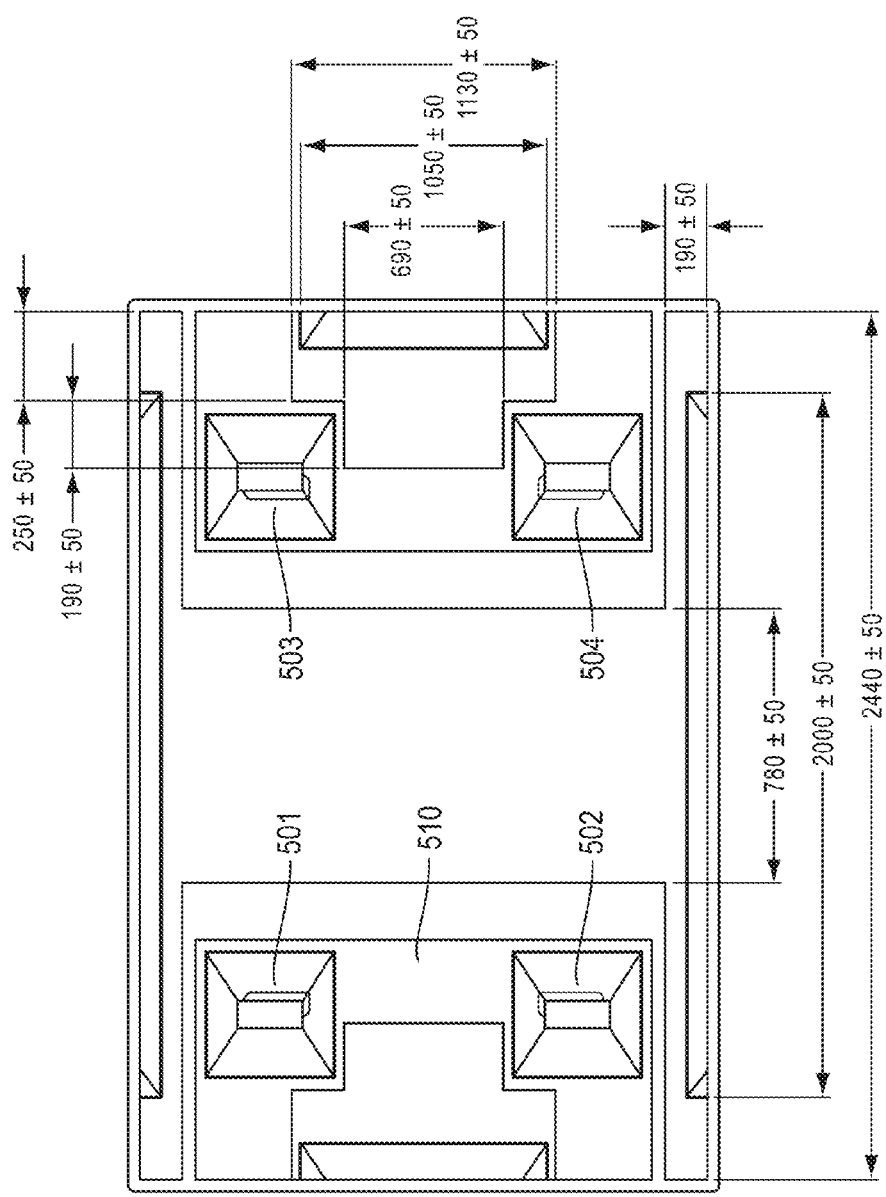
FIG. 5 is a simplified diagram illustrating a conventional LED package. As shown, LED device is positioned within a silicon package.
Figure 6:
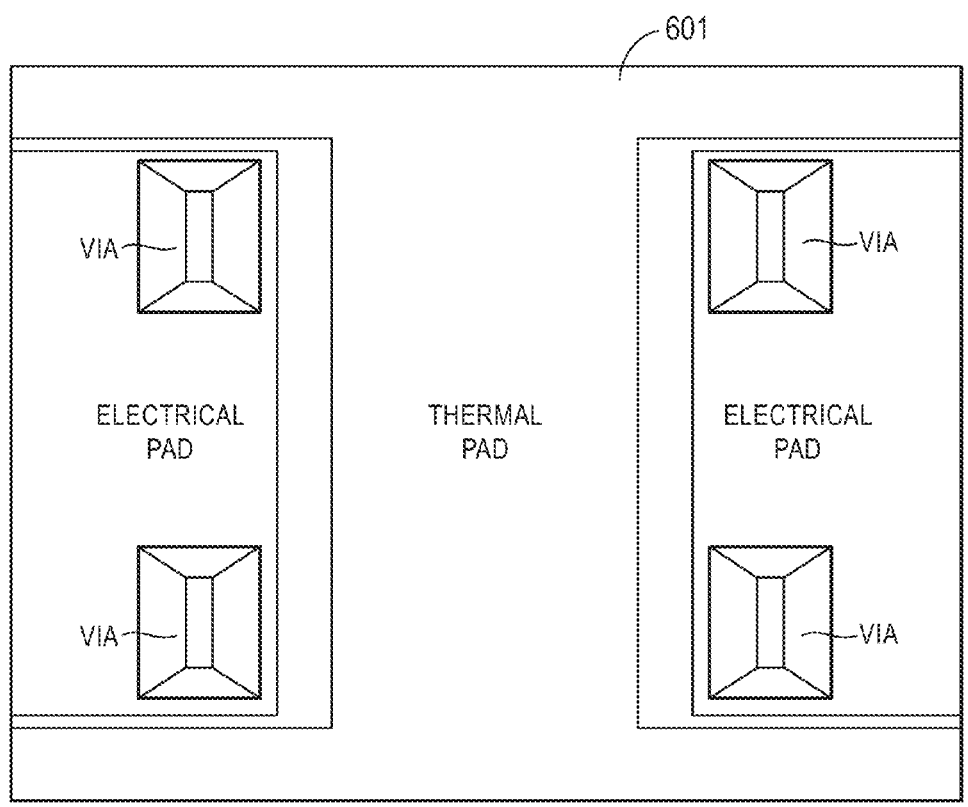
FIG. 6 is a simplified diagram illustrating a thermal pad positioned on a conventional LED package.

FIG. 5 is a simplified diagram illustrating a conventional LED package. As shown, LED device is positioned within a silicon package. For example, the package is a HyLED 700/750 package from Hymite™. In the design of FIG. 5, there are two electrical VIAs per electrical contact and the contacts are on opposing sides of the package. For example, VIAs 501 and 502 are both a part of the electrical contact 510. In the configuration illustrated in FIG. 5, there is very little spacing for a thermal pad. FIG. 6 is a simplified diagram illustrating a thermal pad positioned on a conventional LED package. As shown, the thermal pad 601 in FIG. 6 only occupies a small portion of total area, as the electrical pads occupy a large amount of area. For example, the thermal pad may be able to occupy about 30% of the total base area, which is often insufficient for thermal dissipation.

Figure 7A:
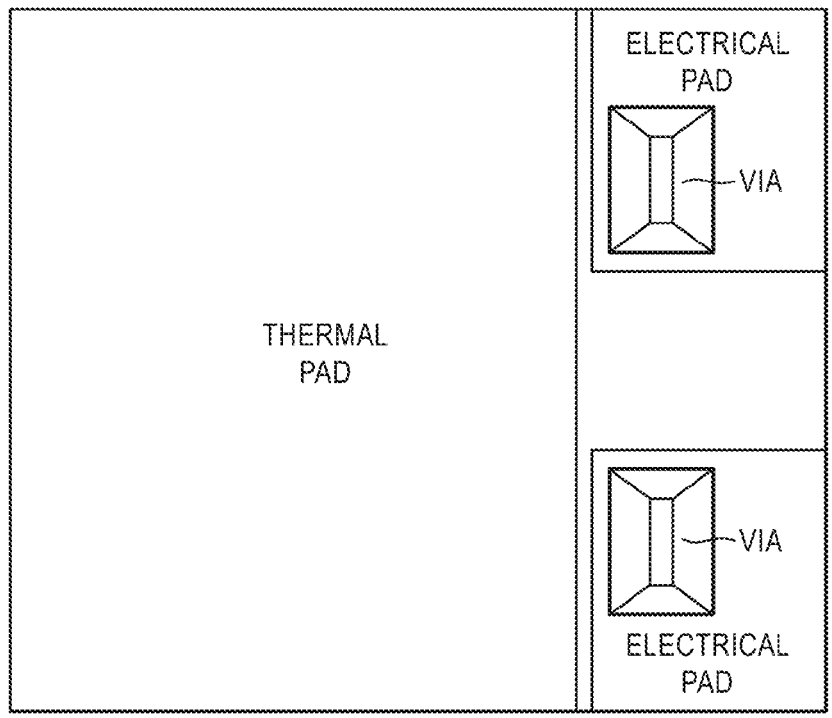
FIGS. 7(a) and 7(b) are simplified diagrams illustrating thermal management structures according to embodiments of the present invention.
Figure 7B:
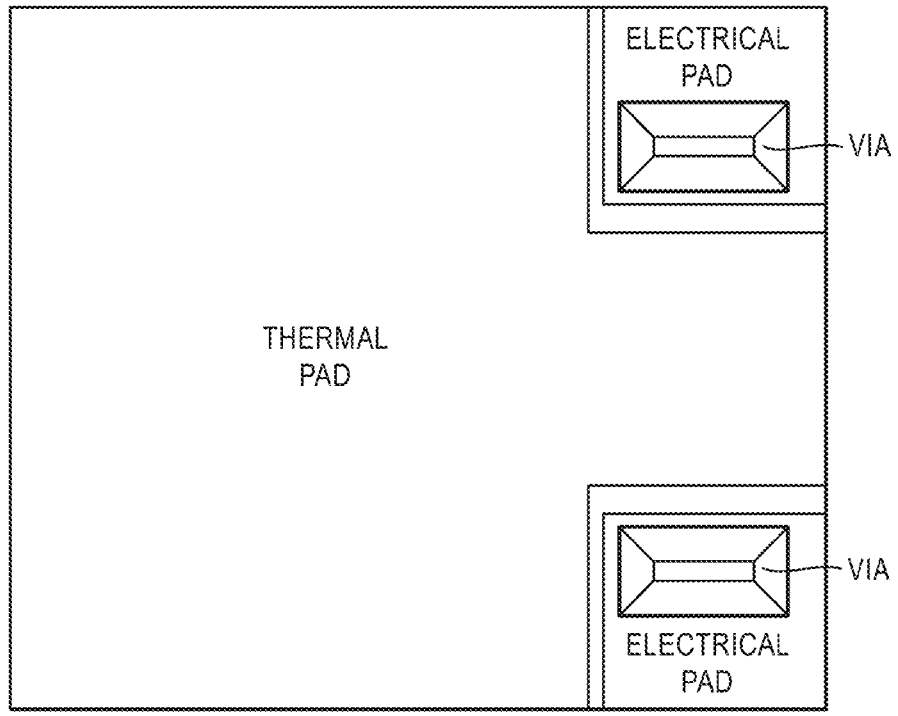

It is therefore to be appreciated that embodiments of the present invention provide improved thermal management structures, such as thermal pad structure with large surface area. FIGS. 7(a) and 7(b) are simplified diagrams illustrating thermal management structures according to embodiments of the present invention. These diagrams are merely an example, which should not unduly limit the scope of the claims. One of ordinary skill in the art would recognize many variations, alternatives, and modifications. As shown in FIG. 7(a), the relative size of thermal pads (relative to electrical pad) is larger that relative size of thermal pad shown in FIG. 6. More specifically, increased thermal pad size is made possible by moving VIAs to the same side of the package. In certain embodiments, only a single VIA is used per contact. As shown in FIGS. 7(a) and 7(b), the thermal pad coverage is up to 80% of the total surface area.

Figure 8:
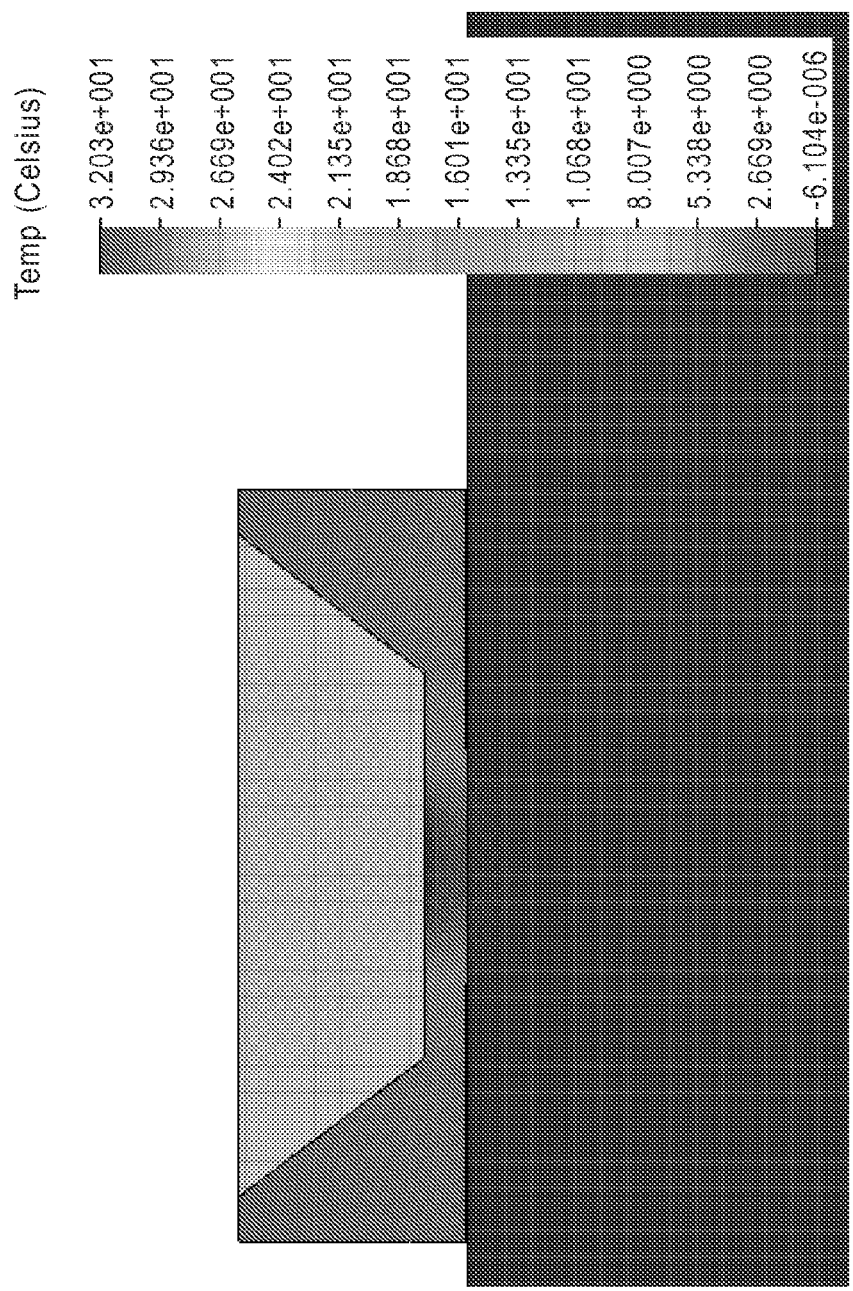
FIG. 8 shows a thermal simulation of the HyLED 700/750 package on aluminum MCPCB.

It is to be appreciated that the increase thermal pad area greatly increases the rate of heat dissipation by the thermal pad structure. FIG. 8 shows a thermal simulation of the HyLED 700/750 package on aluminum MCPCB. As shown in FIG. 8, the contact resistance is set at $3.6 \times 10^{-5}$ (K-m$^2$)/W. For example, in this configuration the HyLED device is characterized by a very high thermal resistance of about 32° C./W.

Figure 9:
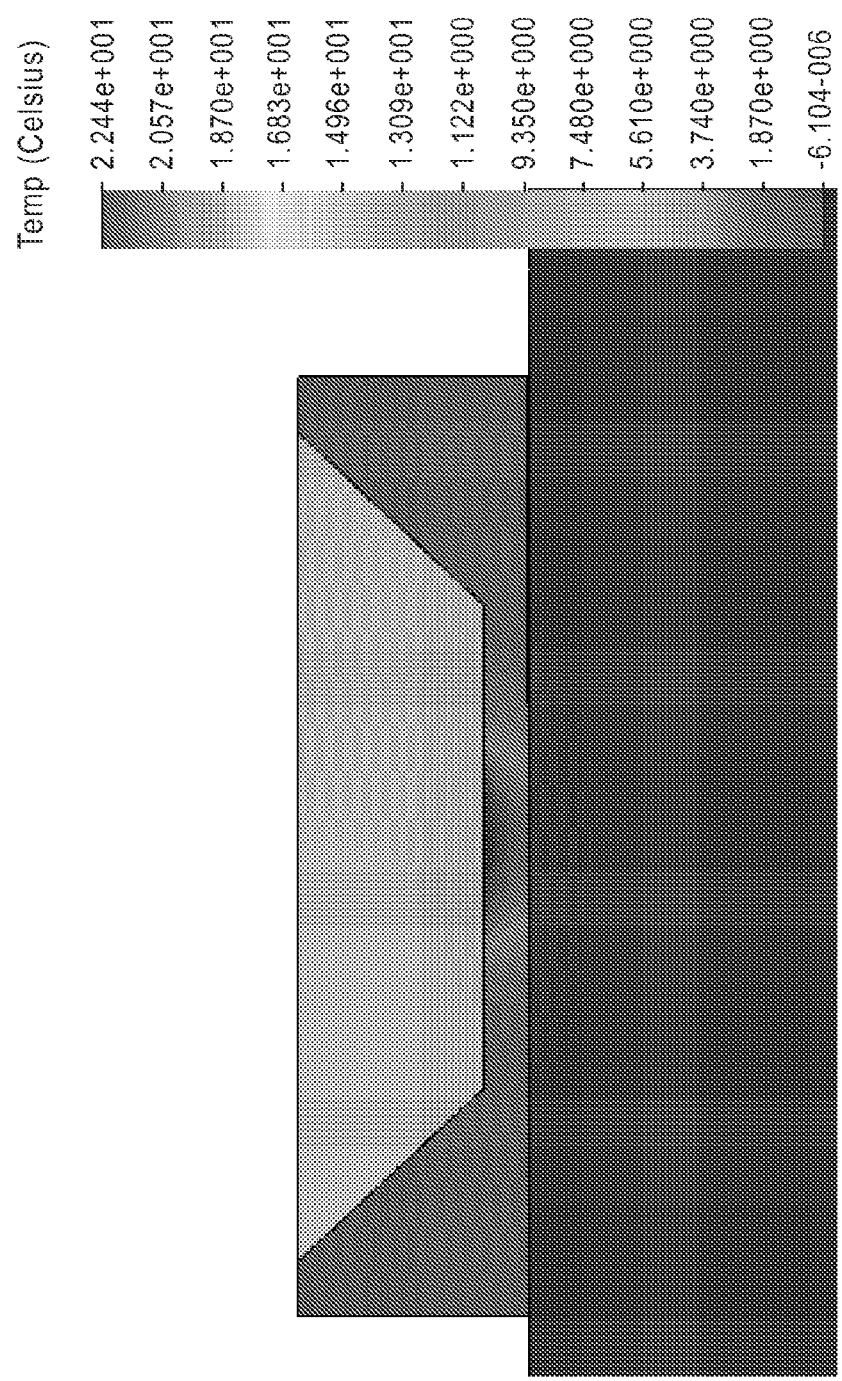
FIG. 9 shows a thermal simulation of an LED package having thermal pad configuration according to embodiments of the present invention.

In comparison, thermal pad structures according to embodiments of the present invention reduces thermal resistance by a substantial amount. FIG. 9 shows a thermal simulation of an LED package having thermal pad configuration according to embodiments of the present invention. This diagram is merely an example, which should not unduly limit the scope of the claims. One of ordinary skill in the art would recognize many variations, alternatives, and modifications. As shown in FIG. 9, when the area of the thermal pad is increased to about 75% of the total area, the thermal resistance is decreased to about 22° C./W.

It is to be appreciated that the specific designs of the thermal pad can be varied depending on the application. In certain embodiments, heat dissipation is accomplished by increasing the thickness of thermal conductive material.

Usually, silicon based LED packages are advantageous as they can processed in large wafer scaled formats. For example, up to 8" silicon wafers are being processed today verses only 2"×4" ceramic tiles used in the early days. However, the conductivity of silicon (80-140 W/m/k) is relatively low when compared to copper (3090 W/m/k) and other metal materials. Further, in some implementations, the thickness of silicon on which the LED is bonded can be rather thin. Sometimes, the thickness of the silicon material can be as low as 150 um. As a result, the thickness and the thermal conductivity of the silicon material limit the thermal spreading and increase thermal resistance, which is highly undesirable for high power densities applications.

Figure 10:
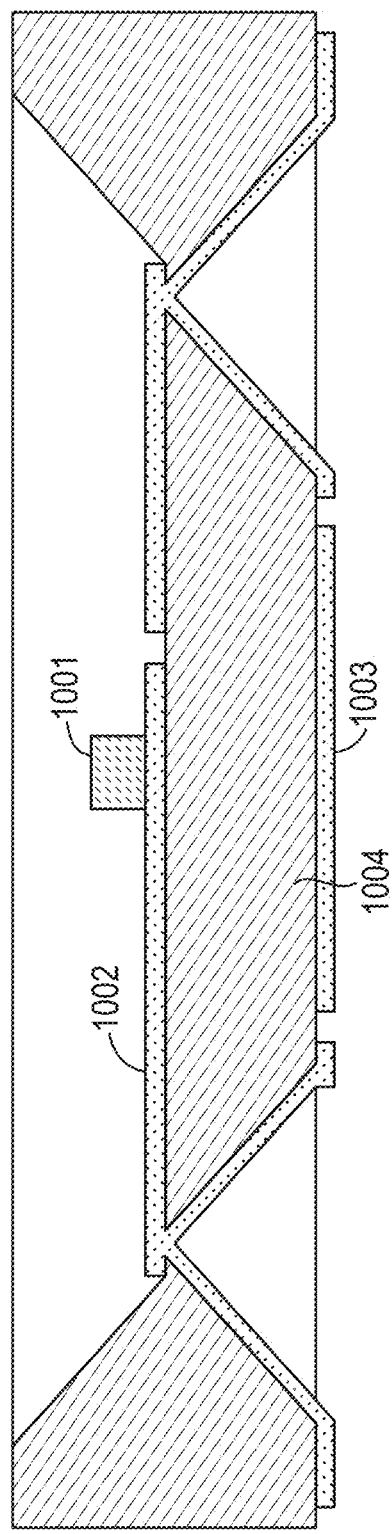
FIG. 10 is a simplified diagram illustrating a conventional LED package.

FIG. 10 is a simplified diagram illustrating a conventional LED package. As shown in FIG. 10, an LED device 1001 is positioned within a silicon package with "V" shaped vias etched on the silicon plane. It is to be understood that the "V" shaped vias are shown for illustrative purposes only; this invention applies equally to other via geometries such as those with relatively straight side walls. More specifically, in FIG. 10 the LED device 1001 is positioned on a conductive layer 1002. Silicon material 1004 is positioned between the conductive layers 1002 and 1003. As explained above, the silicon material 1004 is characterized by a relatively poor thermal conductivity. Additionally, since the conductive layers 1002 and 1003 are relative thin (often less than 10 um), the conductive layers do not help dissipate heat.

Figure 11:
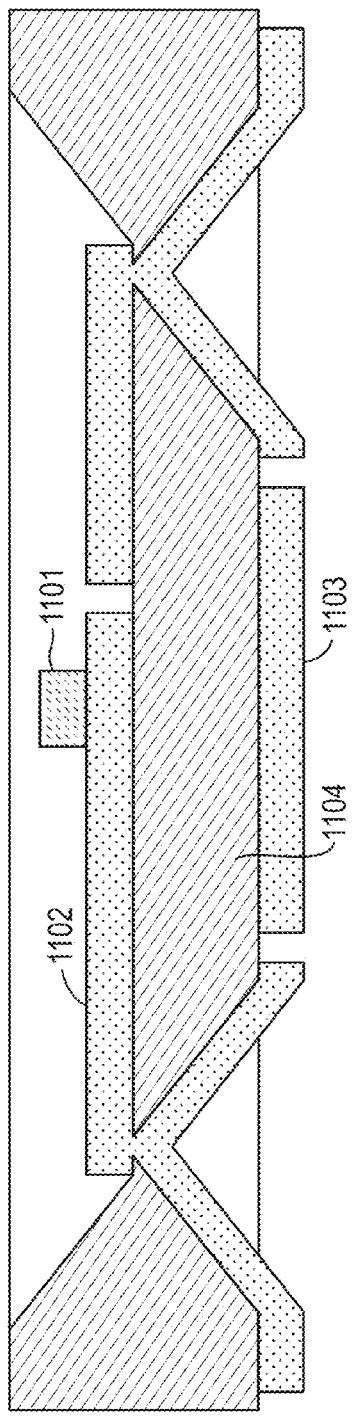
FIG. 11 is a simplified diagram illustrating an LED package with thick conductive layer according to embodiments of the present invention.

In various embodiments, the present invention provides LED packages with thick conductive layers that help dissipate heat from the LED package. FIG. 11 is a simplified diagram illustrating an LED package with thick conductive layer according to embodiments of the present invention. This diagram is merely an example, which should not unduly limit the scope of the claims. One of ordinary skill in the art would recognize many variations, alternatives, and modifications. As shown in FIG. 11, an LED device 1101 is provided on the top side of the conductive layer 1102. For example, the conductive layer 1102 comprises copper material and is characterized by a thickness of at least 25 um. Similarly, the bottom conductive layer 1103 is characterized by a thickness of at least 25 um that provides good thermal conductivity. Having thick layers of thermally conductive material at both top and bottom sides of the silicon substrate 1104, the LED package in FIG. 11 is able to dissipate heat generated by the LED device 1101 through the conductive layer.

Figure 12:
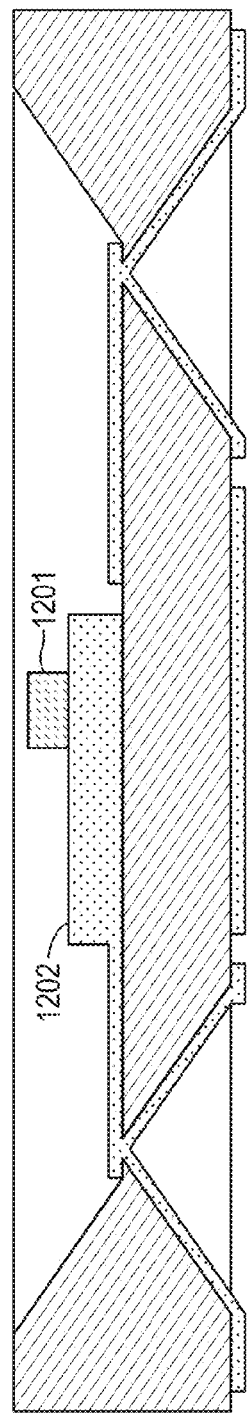
FIG. 12 is a simplified diagram illustrating an LED package with a thermal management structure according to embodiments of the present invention.

It is to be appreciated that other variations of thermal management structures are available as well. FIG. 12 is a simplified diagram illustrating an LED package with a thermal management structure according to embodiments of the present invention. This diagram is merely an example, which should not unduly limit the scope of the claims. One of ordinary skill in the art would recognize many variations, alternatives, and modifications. As shown in FIG. 12, an LED device 1201 is coupled to a conductive layer 1202. a portion (which is in direct contact with the LED device 1201) of the conductive layer 1202 is thicker than other portions of the conductive layer. For example, the conductive layer 1202 comprises copper material and its thick portion is characterized by a thickness of at least 25 um. It is to be appreciated that the thick portion of conductive material increases thermal conductivity and thermal spreading, and it helps heat generated by the LED device to dissipate quickly. As shown, the conductive layer 1202 is substantially thin and can be uniformly plated across all metal surfaces as shown in FIG. 12. Only certain selective regions (e.g., region directly under the LED device 1201) is thick as shown.

Figure 13:
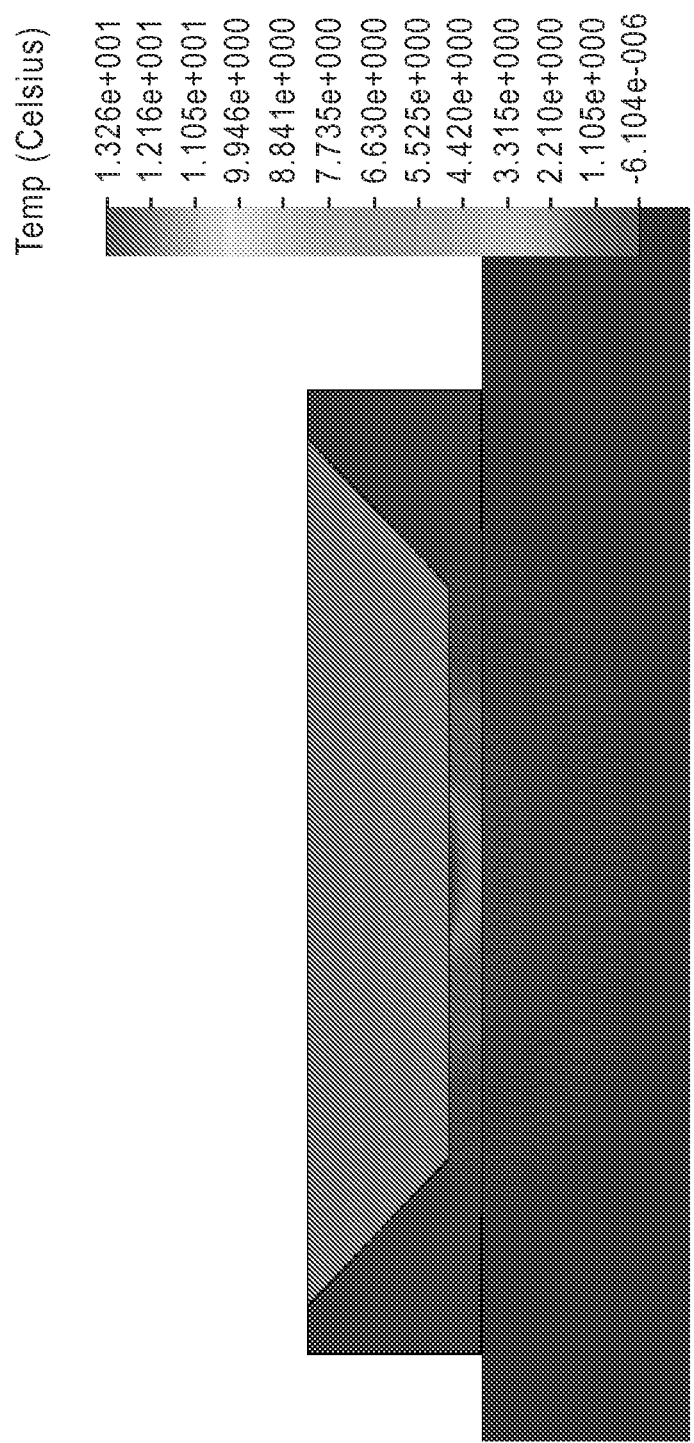
FIG. 13 shows the thermal spreading resistance on a 150 um silicon thick silicon substrate on an aluminum board with a relatively low contact resistance of about $6 \times 10^{-6}$ (° C.-m$^2$)/W.

LED packages with thermal management structures as shown in FIGS. 11 and 12 greatly improves thermal conductivity compared to conventional LED packages. FIG. 13 shows the thermal spreading resistance on a 150 um silicon thick silicon substrate on an aluminum board with a relatively low contact resistance of about $6 \times 10^{-6}$ (° C.-m$^2$)/W. The thermal conductivity of the a conventional LED package is about 13° C./W. Increasing thickness of conductive layers (e.g., 50 microns of copper material illustrated in FIG. 11), the thermal spreading resistance lowered to 7° C./W.

In one or more preferred embodiments, the thermal management structures such as thermal pad and conductive layers can be arranged different or constructed using different types of materials. Similarly, various types of material may be used for the insulating later to improve the reflectivity of the reflective layer. Of course, there can be other variations, modifications, and alternatives. Therefore, the above description and illustrations should not be taken as limiting the scope of the present invention which is defined by the appended claims.

What is claimed is:

1. An optical device comprising:
   an electrically insulating substrate defining an opening, the opening having an interior surface;
   a conductive layer overlying a portion of the interior surface, a portion of the conductive layer being characterized by a thickness of at least 15 μm;
   an LED device electrically coupled to the portion of the conductive layer;
   a layer of insulating material overlying the interior surface and the conductive layer; and
   a reflective layer overlying the layer of insulating material, wherein the reflective layer comprises an opening for a bond pad.

2. The device of claim 1 wherein the device is characterized by a thermal resistance of less than 10° C./W.

3. The device of claim 1 wherein a portion of the substrate positioned below the conductive layer is characterized by a thickness of at least 120 μm.

4. The device of claim 1 wherein the reflective layer comprises a metal.

5. The device of claim 1 wherein the insulating material comprises titanium oxide.

6. The device of claim 1 wherein the insulating material comprises silicon oxide.

7. The device of claim 1 comprising a thermal pad coupled to the interior surface.

8. The device of claim 1 wherein the conductive layer is characterized by a thickness of at least 25 μm.

9. The device of claim 1 wherein the insulating material comprises a dielectric material.

10. The device of claim 1 wherein the conductive layer comprises copper.

11. The device of claim 1 wherein the interior surface comprises a flat surface.

12. The device of claim 11 wherein the reflective layer overlies at least a portion of the flat surface.

13. The device of claim 12 wherein the reflective layer comprises a metal.

14. The device of claim 1 comprising a bond pad positioned within the opening defined by the reflective layer.

15. The device of claim 1 wherein the conductive layer comprises a first conductive region and a second conductive region and an insulation region between the first conductive region and the second conductive region, wherein the insulation region comprises titanium oxide.

16. The device of claim 1 wherein the conductive layer comprises a first conductive region and a second conductive region and an insulation region between the first conductive region and the second conductive region, wherein the insulation region comprises silicon oxide.

17. An optical device comprising:
   an electrically insulating substrate having a top side and a bottom side opposing the top side, wherein the top side defines an opening having an interior surface;
   a top conductive layer overlying a portion of the interior surface, a portion of the top conductive layer having a thickness of at least 15 μm;
   a bottom conductive layer overlying and contacting a portion of the bottom side of the substrate;
   an LED device electrically coupled to the top conductive layer; and
   a reflective layer overlying the top conductive layer, wherein the reflective layer comprises an opening for a bond pad.

18. The optical device of claim 17 comprising an insulating layer positioned between the top conductive layer and the reflective layer.

19. The device of claim 17 wherein the device is characterized by a thermal resistance of less than 10° C./W.

20. The device of claim 17 wherein a portion of the substrate positioned below the first conductive region is characterized by a thickness of at least 120 μm.

21. The device of claim 17 comprising an insulating layer overlying at least a portion of the interior surface.

22. The device of claim 21 wherein the insulating layer comprises titanium oxide.

23. The device of claim 17 wherein the interior surface comprises a flat surface.

24. The device of claim 23 wherein the reflective layer overlies at least a portion of the flat surface.

25. The device of claim 17 wherein the reflective layer comprises a metal.

26. The device of claim 17 comprising a bond pad positioned within the opening defined by the reflective layer.

* * * * *